United States Patent
Paek et al.

(10) Patent No.: US 10,483,222 B1
(45) Date of Patent: Nov. 19, 2019

(54) SEMICONDUCTOR DEVICE AND MANUFACTURING METHOD THEREOF

(71) Applicant: Amkor Technology, Inc., Tempe, AZ (US)

(72) Inventors: Jong Sik Paek, Seongnam-si (KR); Eun Sook Sohn, Seoul (KR); In Bae Park, Seoul (KR); Won Chul Do, Seoul (KR); Glenn A. Rinne, Taipei (TW)

(73) Assignee: Amkor Technology, Inc., Tempe, AZ (US)

( * ) Notice: Subject to any disclaimer, the term of this patent is extended or adjusted under 35 U.S.C. 154(b) by 0 days.

(21) Appl. No.: 15/383,923

(22) Filed: Dec. 19, 2016

Related U.S. Application Data

(63) Continuation of application No. 13/738,669, filed on Jan. 10, 2013, now Pat. No. 9,524,906, which is a
(Continued)

(51) Int. Cl.
*H01L 21/00* (2006.01)
*H01L 23/00* (2006.01)

(52) U.S. Cl.
CPC .............. *H01L 24/05* (2013.01); *H01L 24/11* (2013.01); *H01L 24/13* (2013.01); *H01L 2224/0401* (2013.01); *H01L 2224/05008* (2013.01); *H01L 2224/05015* (2013.01); *H01L 2224/11334* (2013.01); *H01L 2224/13014* (2013.01); *H01L 2224/13024* (2013.01)

(58) Field of Classification Search
CPC ......... H01L 24/05; H01L 24/11; H01L 24/13; H01L 2224/11334
See application file for complete search history.

(56) References Cited

U.S. PATENT DOCUMENTS 5,892,179 A * 4/1999 Rinne ............... H01L 24/11
174/261
6,011,314 A * 1/2000 Leibovitz .......... H01L 23/525
257/751

(Continued)

FOREIGN PATENT DOCUMENTS

| JP | 2008-218629 | 9/2008 |
| KR | 10-0645755 | 11/2000 |
| KR | 10-1025408 | 12/2008 |

OTHER PUBLICATIONS

Anderson et al., "Advances in WLCSP Technologies for Growing Market Needs," Proceedings of SMTA's 6th Annual International Wafer Level Packaging Conference, Oct. 27-30, 2009, 6 pages, Santa Clara, CA.
(Continued)

*Primary Examiner* — Laura M Menz
(74) *Attorney, Agent, or Firm* — McAndrews, Held & Malloy, Ltd.

(57) ABSTRACT

A semiconductor device and a manufacturing method thereof are disclosed. A first insulation layer is formed on a semiconductor die, a redistribution layer electrically connected to a bond pad is formed on the first insulation layer, and a second insulation layer covers the redistribution layer. The second insulation layer is made of a cheap, non-photosensitive material. Accordingly, the manufacturing cost of the semiconductor device can be reduced.

19 Claims, 11 Drawing Sheets

Related U.S. Application Data continuation of application No. 12/728,119, filed on Mar. 19, 2010, now Pat. No. 8,362,612.

(56) References Cited

U.S. PATENT DOCUMENTS

| | | | |
|---|---|---|---|
| 6,187,615 B1 | 2/2001 | Kim | |
| 6,329,608 B1* | 12/2001 | Rinne | H01L 24/11 174/261 |
| 6,388,203 B1* | 5/2002 | Rinne | C08F 8/44 174/261 |
| 6,389,691 B1* | 5/2002 | Rinne | H01L 24/11 29/843 |
| 6,392,163 B1* | 5/2002 | Rinne | C08F 8/44 174/261 |
| 6,410,414 B1 | 6/2002 | Lee | |
| 6,455,408 B1* | 9/2002 | Hwang | H01L 23/3114 257/E21.508 |
| 6,620,633 B2 | 9/2003 | Hembree et al. | |
| 6,835,595 B1 | 2/2004 | Suzuki et al. | |
| 6,841,874 B1* | 1/2005 | Paek | H01L 23/3114 257/738 |
| 6,987,319 B1* | 1/2006 | Paek | H01L 23/3114 257/738 |
| 7,023,088 B2 | 4/2006 | Suzuki et al. | |
| 7,045,893 B1* | 5/2006 | Paek | H01L 23/3128 257/692 |
| 7,049,682 B1 | 5/2006 | Mathews et al. | |
| 7,096,581 B2* | 8/2006 | Thomas | H01L 23/3114 257/637 |
| 7,157,363 B2 | 1/2007 | Suzuki et al. | |
| 7,183,498 B2 | 2/2007 | Ogura et al. | |
| 7,183,645 B2* | 2/2007 | Kurosawa | H01L 23/3114 257/737 |
| 7,205,660 B2* | 4/2007 | Park | H01L 23/3114 257/737 |
| 7,312,143 B2* | 12/2007 | Park | H01L 23/3114 438/613 |
| 7,335,986 B1* | 2/2008 | Paek | H01L 23/3114 257/723 |
| 7,545,027 B2* | 6/2009 | Chung | H01L 23/3114 257/678 |
| 7,547,623 B2* | 6/2009 | Mis | H01L 21/2885 438/584 |
| 7,566,650 B2* | 7/2009 | Lin | H01L 24/11 257/E21.506 |
| 7,659,604 B2 | 2/2010 | Fujiwara et al. | |
| 7,674,701 B2 | 3/2010 | Rinne | |
| 7,776,655 B2* | 8/2010 | Do | H01L 21/6835 257/E21.599 |
| 7,808,105 B1* | 10/2010 | Paek | H01L 23/3171 257/750 |
| 7,839,000 B2* | 11/2010 | Mis | H01L 21/2885 257/779 |
| 7,901,956 B2* | 3/2011 | Kuan | H01L 22/34 257/E23.021 |
| 7,932,615 B2* | 4/2011 | Rinne | H01L 23/3114 257/786 |
| 7,944,048 B2 | 5/2011 | Jiang | |
| 7,977,783 B1* | 7/2011 | Park | H01L 24/11 257/692 |
| 7,977,789 B2* | 7/2011 | Park | H01L 24/03 257/737 |
| 7,993,976 B2* | 8/2011 | Do | H01L 21/76898 257/E21.499 |
| 8,058,726 B1* | 11/2011 | Jin | H01L 23/3192 257/678 |
| 8,093,691 B1 | 1/2012 | Fuentes et al. | |
| 8,247,889 B2 | 8/2012 | Liao et al. | |
| 8,362,612 B1 | 1/2013 | Paek et al. | |
| 8,552,557 B1 | 10/2013 | Nangalia et al. | |
| 8,614,899 B2 | 12/2013 | Madsen et al. | |
| 8,664,090 B1 | 3/2014 | Nangalia et al. | |
| 8,872,312 B2 | 10/2014 | Wang et al. | |
| 8,897,028 B2 | 11/2014 | Takemura | |
| 9,070,793 B2 | 6/2015 | Liao et al. | |
| 9,123,543 B1 | 9/2015 | Jin et al. | |
| 9,524,906 B1 | 12/2016 | Paek et al. | |
| 2002/0076913 A1 | 6/2002 | Lee | |
| 2003/0214038 A1 | 11/2003 | Nemoto | |
| 2005/0012225 A1* | 1/2005 | Choi | H01L 21/568 257/782 |
| 2006/0030139 A1* | 2/2006 | Mis | H01L 21/2885 438/612 |
| 2006/0038291 A1* | 2/2006 | Chung | H01L 23/3114 257/738 |
| 2006/0055037 A1* | 3/2006 | Park | H01L 24/11 257/737 |
| 2006/0214293 A1* | 9/2006 | Park | H01L 23/3114 257/737 |
| 2007/0069346 A1* | 3/2007 | Lin | H01L 24/11 257/673 |
| 2007/0108573 A1* | 5/2007 | Chung | H01L 23/3114 257/678 |
| 2007/0164431 A1* | 7/2007 | Lee | H01L 23/3114 257/737 |
| 2007/0176290 A1* | 8/2007 | Park | H01L 23/3114 257/737 |
| 2007/0182004 A1* | 8/2007 | Rinne | H01L 23/3114 257/734 |
| 2007/0184643 A1* | 8/2007 | Rinne | H01L 21/0272 438/612 |
| 2007/0252275 A1* | 11/2007 | Huang | H01L 21/76838 257/737 |
| 2008/0012124 A1 | 1/2008 | Stapleton et al. | |
| 2008/0042275 A1* | 2/2008 | Kuan | H01L 24/11 257/673 |
| 2008/0128905 A1* | 6/2008 | Lee | H01L 23/3114 257/737 |
| 2008/0160682 A1* | 7/2008 | Song | H01L 23/5258 438/132 |
| 2009/0166859 A1* | 7/2009 | Yuan | H01L 24/03 257/737 |
| 2009/0212427 A1* | 8/2009 | Mis | H01L 21/2885 257/737 |
| 2009/0250813 A1* | 10/2009 | Lin | H01L 24/11 257/737 |
| 2009/0283903 A1* | 11/2009 | Park | H01L 24/03 257/737 |
| 2010/0320624 A1* | 12/2010 | Kang | H01L 21/568 257/787 |
| 2011/0068427 A1* | 3/2011 | Paek | H01L 24/19 257/433 |
| 2011/0104888 A1* | 5/2011 | Kim | H01L 21/76813 438/637 |
| 2011/0121295 A1* | 5/2011 | Kuan | H01L 22/34 257/48 |
| 2011/0229822 A1 | 9/2011 | Stapleton | |
| 2011/0240912 A1* | 10/2011 | Kang | C09K 13/08 252/79.3 |
| 2011/0272819 A1* | 11/2011 | Park | H01L 24/02 257/774 |
| 2011/0278707 A1* | 11/2011 | Chi | H01L 21/4832 257/676 |
| 2012/0008288 A1 | 1/2012 | Tsukamoto et al. | |
| 2012/0044653 A1 | 2/2012 | Morris et al. | |
| 2014/0016293 A1 | 1/2014 | Song | |
| 2015/0036296 A1 | 2/2015 | Chen et al. | |
| 2015/0043172 A1 | 2/2015 | Mugiya et al. | |
| 2015/0049439 A1 | 2/2015 | Shimamura et al. | |
| 2015/0070849 A1 | 3/2015 | Shimamura et al. | |

OTHER PUBLICATIONS

Stapleton et al., "Reliability of 400 μm Pitch WLCSP Assemblies with Solder Supporting Material," IWLPC Conference Proceedings, Oct. 30, 2009, pp. 168-171.

Stapleton, "Wafer Level Packaging: A Materials Roadmap," IMAPS Chandler, Aug. 2009, 21 pages.

(56) References Cited

OTHER PUBLICATIONS

No author provided, "Fujikura Wafer Level Chip Sized Package (WLCSP) Design Guide", May 16, 2001, Rev. I.4e, 14 pages.

No author provided, "Wafer-Applied Underfill, LORD Scientist Featured by IMAPS," LORD Corporation News Center, 1 page [online], Retrieved on Nov. 3, 2011 from the Internet: <URL:http://www.lord.com/news-center/news-stories/wafer-applied-underfill-lord-scientist-featured-by-imaps.xml>.

No author provided, "LORD Corporation's Stapleton to Speak at International Wafer-Level Packaging Conference," LORD Corporation News Center, 1 page [online], Retrieved on Nov. 3, 2011 from the Internet: <URL:http://www.lord.com/news-center/press-releases/lord-corporations-stapleton-to-speak-at-international-wafer-level-packaging-conference.xml>.

* cited by examiner

SEMICONDUCTOR DEVICE AND MANUFACTURING METHOD THEREOF

CROSS-REFERENCE TO RELATED APPLICATIONS/INCORPORATION BY REFERENCE

The present application is a continuation of U.S. patent application Ser. No. 13/738,669, filed Jan. 10, 2013, expected to issue as U.S. Pat. No. 9,524,906 on Dec. 20, 2016, and titled "SEMICONDUCTOR DEVICE AND MANUFACTURING METHOD THEREOF," which is a continuation of U.S. patent application Ser. No. 12/728,119, filed Mar. 19, 2010, now U.S. Pat. No. 8,362,612, and titled "SEMICONDUCTOR DEVICE AND MANUFACTURING METHOD THEREOF", the contents of each of which are hereby incorporated herein by reference in their entirety.

BACKGROUND OF THE INVENTION

Field of the Invention

The present invention relates to a semiconductor device and a manufacturing method thereof.

Description of the Related Art

In the field of semiconductor devices having a chip scale package (CSP) structure, a semiconductor device is manufactured such that after the manufacturing process has been accomplished, a resultant wafer is completed and then singulated as individual semiconductor chips.

A conventional CSP semiconductor device includes a passivation layer, a first insulation layer, a second insulation layer, and a solder ball. The passivation layer is formed at the outer periphery of a bond pad of a semiconductor die. The first insulation layer is formed on the passivation layer and the second insulation layer is formed on a redistribution layer electrically connected to the bond pad. The second insulation layer is a photosensitive material that is patterned to form an opening therein. The solder ball is electrically connected to the redistribution layer through the opening of the second insulation layer.

BRIEF SUMMARY OF THE INVENTION

A semiconductor device and a manufacturing method thereof are disclosed. A first insulation layer is formed on a semiconductor die, a redistribution layer electrically connected to a bond pad is formed on the first insulation layer, and a second insulation layer covers the redistribution layer. The second insulation layer is made of a cheap, non-photosensitive material. Accordingly, the manufacturing cost of the semiconductor device can be reduced.

The present invention will be more apparent from the following detailed description taken in conjunction with the accompanying drawings.

BRIEF DESCRIPTION OF THE DRAWINGS

Common reference numerals are used throughout the drawings and the detailed description to indicate the same elements.

DETAILED DESCRIPTION OF THE INVENTION

Figure 1:
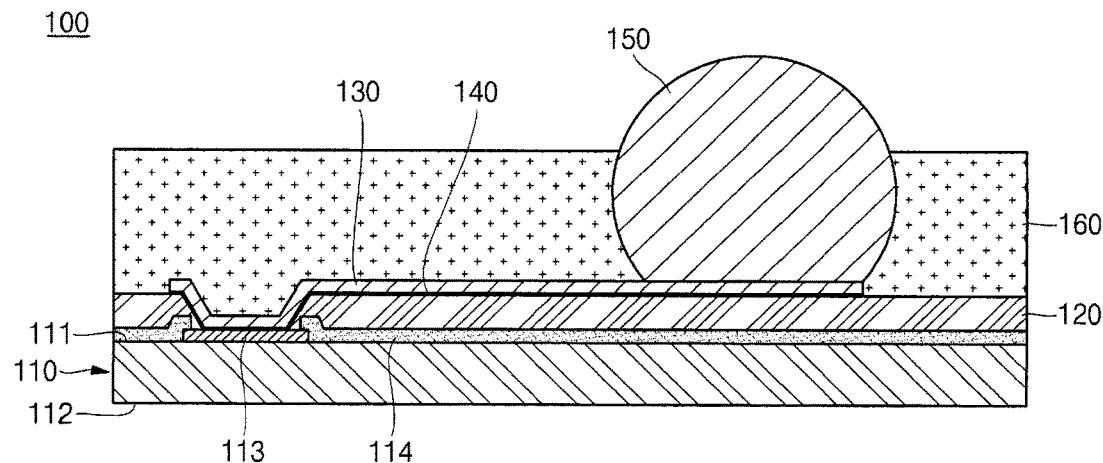
FIG. 1 is a sectional view illustrating a semiconductor device according to an embodiment of the present invention.

Referring to FIG. 1, a sectional view of a semiconductor device 100 according to an embodiment of the present invention is illustrated.

As illustrated in FIG. 1, the semiconductor device 100 according to an embodiment of the present invention includes a semiconductor die 110, a first insulation layer 120, a redistribution layer 130, a redistribution seed layer 140, a solder ball 150, and a second insulation layer 160.

The semiconductor die 110 is generally made of silicon, and includes a first surface 111, and a second surface 112 that is substantially planar and opposite to the first surface 111. The semiconductor die 110 also includes at least one bond pad 113 formed on the first surface 111. The bond pad 113 is a portion through which an electrical signal is input/output to/from the semiconductor die 110. Although the bond pad 113 is made of aluminum in the illustrated embodiment, a material of the bond pad 113 is not limited thereto. The semiconductor die 110 further includes a passivation layer 114 formed on a portion of the first surface 111 excluding the bond pad 113, that is, an outer periphery of the bond pad 113. The passivation layer 114 may be made of any one selected from an oxide layer ($SiO_2$), a nitride layer ($Si_3N_4$), equivalents thereof, but aspects of the present invention are not limited thereto.

The first insulation layer 120 is formed on the passivation layer 114 corresponding to the outer periphery of the bond pad 113 to a certain thickness. That is to say, the first insulation layer 120 only covers the passivation layer 114 without covering the bond pad 113, i.e., the first insulation layer 120 has an opening formed therein through which the bond pad 113 is exposed. The first insulation layer 120 allows the semiconductor die 110 to be electrically insulated at areas other than the bond pad 113. The first insulation layer 120 may be made of at least one selected from the group consisting of polyimide (PI), benzocyclobutene (BCB), polybenzoxazole (PBO), bismaleimidetriazine (BT), phenolic resin, and equivalents thereof, but aspects of the present invention are not limited thereto.

One end of the redistribution layer 130 is formed over the bond pad 113 and the other end thereof is formed to extend to an upper portion of the first insulation layer 120 by a certain length and generally to extend on the first surface 111 of the semiconductor die. The redistribution layer 130 serves to distribute an electric route of the semiconductor die 110. That is to say, the redistribution layer 130 relocates the electric route, so that the solder ball 150 may be adaptively connected to a pattern of the external circuit, irrespective of the location of the bond pad 113. The redistribution layer 130 may be made of at least one selected from the group consisting of copper (Cu), and equivalents thereof, but aspects of the present invention are not limited thereto.

The redistribution seed layer 140 may be formed between the redistribution layer 130 and the bond pad 113 and between the redistribution layer 130 and the first insulation layer 120. Generally, the redistribution seed layer 140 is between the redistribution layer 130 and the first surface 111 of the semiconductor die 110. The redistribution seed layer 140 may be formed by sequentially depositing titanium (Ti) and copper (Cu) or by sequentially depositing titanium tungsten (TiW) and copper (Cu), but aspects of the present invention may not be limited thereto. The redistribution seed layer 140 allows the redistribution layer 130 to be easily plated and firmly attached to the first insulation layer 120.

The solder ball 150 is fusibly attached onto the redistribution layer 130 in a substantially spherical shape. The solder ball 150 transfers electrical signals between the semiconductor die 110 and external circuits. The solder ball 150 may be made of at least one selected from the group consisting of Sn—Pb, Sn—Pb—Ag, Sn—Pb—Bi, Sn—Cu, Sn—Ag, Sn—Bi, Sn—Ag—Cu, Sn—Ag—Bi, Sn—Zn, and equivalents thereof, but aspects of the present invention are not limited thereto.

In order to securely bond the solder ball 150 with the redistribution layer 130, an under bumped metallurgy (UBM) layer (not illustrated) may further be provided between the solder ball 150 and the redistribution layer 130. The UBM layer may have at least one structure selected from the group consisting of multi-layered structures, including, but not limited to, chrome/chrome-copper alloy/copper (Cr/Cr-Cu/Cu), titanium-tungsten alloy/copper (Ti—W/Cu), aluminum/nickel/copper (Al/Ni/Cu), and equivalents thereof.

The second insulation layer 160 is formed directly on the redistribution layer 130 and on the first insulation layer 120 without the redistribution layer 130 to a predetermined thickness. Here, the second insulation layer 160 is formed such that the solder ball 150 is exposed upward. The second insulation layer 160 covers the redistribution layer 130, thereby preventing oxidation and contamination of the redistribution layer 130. The second insulation layer 160 may be made of at least one non-photosensitive material selected from the group consisting of epoxy molding compound (EMC), polyimide (PI), benzocyclobutene (BCB), polybenzoxazole (PBO), bismaleimidetriazine (BT), phenolic resin, and equivalents thereof, but aspects of the present invention are not limited thereto. The non-photosensitive material for use in the second insulation layer 160 is cheaper than a photosensitive material for use in the first insulation layer 120. Here, since the solder ball 150 is first formed and the second insulation layer 160 is then formed, a photolithography process is not necessarily performed to form the second insulation layer 160. Therefore, the second insulation layer 160 may be made of a cheap, non-photosensitive material. That is to say, in a case where the solder ball 150 is formed before forming the second insulation layer 160, it is not necessary to perform a photolithography process for forming openings to distribute the solder ball 150 in the second insulation layer 160.

As described above, in the semiconductor device 100 according to an embodiment of the present invention, the second insulation layer 160 is made of a cheap, non-photosensitive material. Accordingly, the manufacturing cost is reduced, compared to a case where both the first insulation layer and the second insulation layer are made of costly, photosensitive materials. A board level reliability in a stackable semiconductor device can also be improved.

Next, a semiconductor device 200 according to another embodiment of the present invention will be described.

Figure 2:
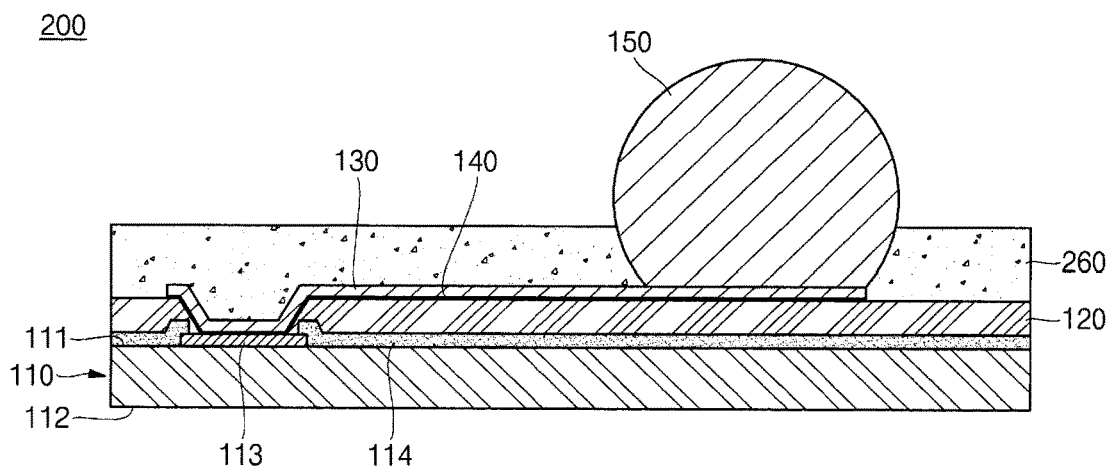
FIG. 2 is a sectional view illustrating a semiconductor device according to another embodiment of the present invention.

Referring to FIG. 2, a sectional view illustrating a semiconductor device according to another embodiment of the present invention is illustrated.

As illustrated in FIG. 2, the semiconductor device 200 according to another embodiment of the present invention includes a semiconductor die 110, a first insulation layer 120, a redistribution layer 130, a redistribution seed layer 140, a solder ball 150, and a second insulation layer 260.

The semiconductor device 200 has substantially the same configuration and operation as the semiconductor device 100 according to the previous embodiment, except for the configuration of the second insulation layer 260. Accordingly, components each having the same configuration and operation for describing the previous embodiment are respectively identified by the same reference numerals, and their repetitive description will not be given. In the following, an explanation will be given with special reference to the second insulation layer 260.

The second insulation layer 260 has substantially the same configuration and operation with the second insulation layer 160. However, the second insulation layer 260 according to the present embodiment is formed by attaching an insulative dry film, i.e., non-photosensitive material, on the redistribution layer 130 and the first insulation layer 120 without the redistribution layer 130.

As described above, in the semiconductor device 200 according to another embodiment of the present invention, the second insulation layer 260 is made of a cheap, non-photosensitive material, such as an insulative dry film, compared to a case where both the first insulation layer and the second insulation layer are made of costly, photosensitive materials. Accordingly, the manufacturing process can be simplified and the manufacturing cost is also reduced.

Next, a semiconductor device 300 according to still another embodiment of the present invention will be described.

Figure 3:
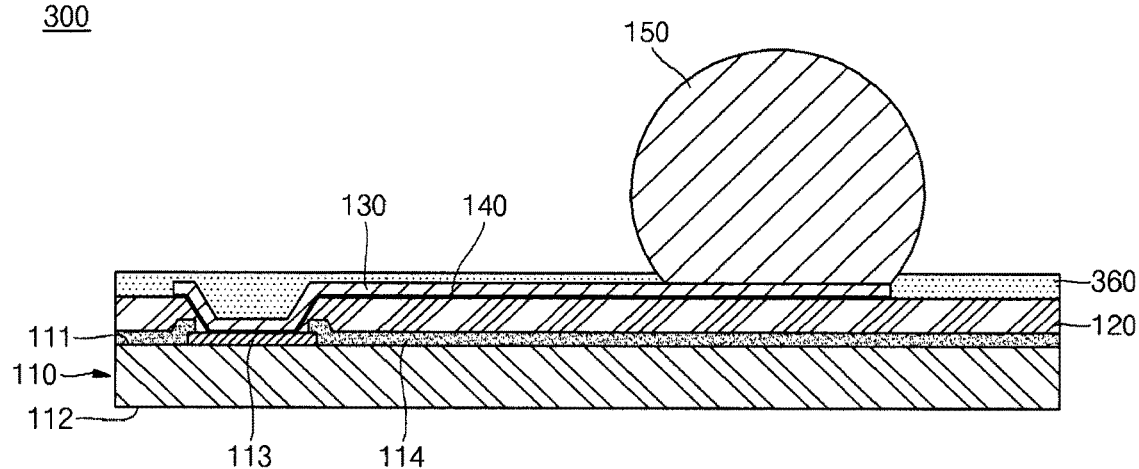
FIG. 3 is a sectional view illustrating a semiconductor device according to still another embodiment of the present invention.

Referring to FIG. 3, a sectional view illustrating a semiconductor device 300 according to still another embodiment of the present invention is illustrated.

As illustrated in FIG. 3, the semiconductor device 300 includes a semiconductor die 110, a first insulation layer 120, a redistribution layer 130, a redistribution seed layer 140, a solder ball 150, and a second insulation layer 360.

The semiconductor device 300 has substantially the same configuration and operation as the semiconductor device 100 illustrated in FIG. 1, except for the configuration of the second insulation layer 360. Accordingly, components each having the same configuration and operation for describing the previous embodiment are respectively identified by the same reference numerals, and their repetitive description will not be given. In the following, an explanation will be given with special reference to the second insulation layer 360.

The second insulation layer 360 has substantially the same configuration and operation with the second insulation layer 160. However, the second insulation layer 360 according to the present embodiment is made of epoxy, i.e. a non-photosensitive material.

As described above, in the semiconductor device 300 according to still another embodiment of the present invention, the second insulation layer 360 is made of a cheap, non-photosensitive material such as epoxy, thereby reducing the manufacturing cost, compared to a case where both the first insulation layer and the second insulation layer are made of costly, photosensitive materials.

Next, a semiconductor device 400 according to still another embodiment of the present invention will be described.

Figure 4:
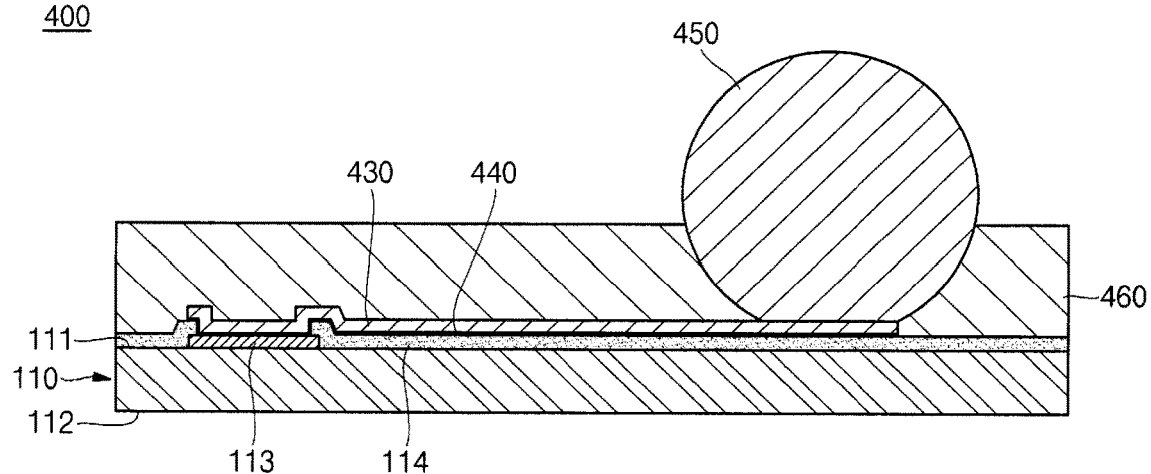
FIG. 4 is a sectional view illustrating a semiconductor device according to still another embodiment of the present invention.
Figure 5:
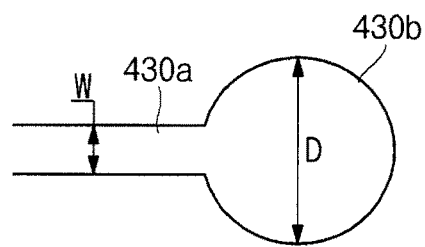
FIG. 5 is a plan view illustrating a trace and a ball pad in a redistribution layer.
Figure 6:
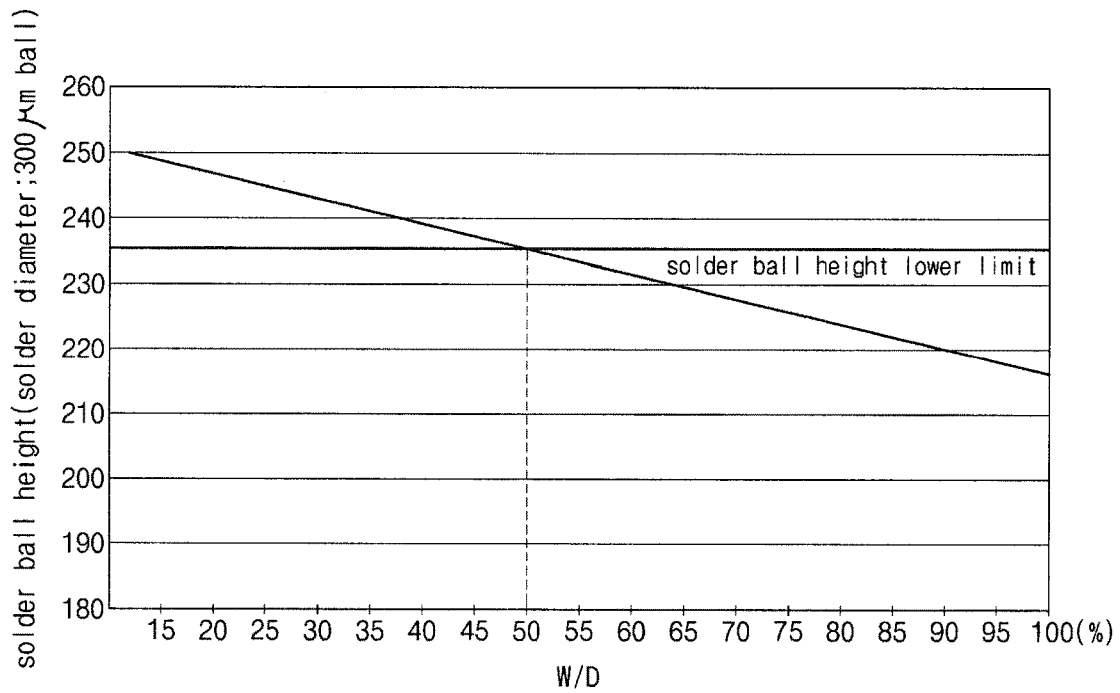
FIG. 6 is a graph illustrating measurement data of solder ball heights depending on ratios of trace line widths to ball pad diameters.

Referring to FIG. 4, a sectional view illustrating a semiconductor device 400 according to still another embodiment of the present invention is illustrated. Referring to FIG. 5, a plan view illustrating a trace 430a and a ball pad 430b in a redistribution layer is illustrated. Referring to FIG. 6, a graph illustrating measurement data of solder ball heights depending on ratios of trace line widths to ball pad diameters is illustrated.

As illustrated in FIG. 4, the semiconductor device 400 includes a semiconductor die 110, a redistribution layer 430, a redistribution seed layer 440, a solder ball 450, and an insulation layer 460.

The semiconductor device 400 has substantially the same configuration and operation with the semiconductor device 100 illustrated in FIG. 1, except for the first redistribution layer 430, the redistribution seed layer 440, the solder ball 450 and the insulation layer 460, and the first insulation layer 120 of FIG. 1 is omitted. Accordingly, components each having the same configuration and operation for describing the previous embodiment are respectively identified by the same reference numerals, and their repetitive description will not be given. In the following, an explanation will be given with special reference to the redistribution layer 430, the redistribution seed layer 440, the solder ball 450, and the insulation layer 460.

The redistribution layer 430 has substantially the same configuration and operation with the redistribution layer 130 illustrated in FIG. 1. In the embodiment illustrated in FIG. 4, however, in which the insulation layer 120 of FIG. 1 is not formed, one end of the redistribution layer 430 is electrically connected to the bond pad 113 and the other end thereof is extended over the passivation layer 114, not the insulation layer 120 of FIG. 1, by a predetermined length.

In a specific embodiment, as illustrated in FIG. 5, the redistribution layer 430 may include a line-shaped trace 430a and a circular ball pad 430b connected to the trace 430a and attached with the solder ball 450. Here, the redistribution layer 430 is formed such that a line width W of the trace 430a becomes 50% or less of a diameter D of the ball pad 430b. That is to say, the redistribution layer 430 is formed such that a ratio of the line width to the diameter, i.e., W/D, may not exceed 50%. The reason of the foregoing is to attain the solder ball 450 having a predetermined height while suppressing the solder ball 450 from horizontally flowing along the trace 430a of the redistribution layer 430 when the solder ball 450 is fusibly attached to the ball pad 430b. FIG. 6 is a graph illustrating measurement data of W/D dependent heights of the solder ball 450 assuming that the diameter of the solder ball 450 is 300 µm, the diameter of the ball pad 430b is 250 µm, and the height lower limit of the solder ball 450 fusibly attached to the ball pad 430b is 235 µm. As illustrated in FIG. 6, in a case where the W/D is greater than 50%, the height of the solder ball 450 was smaller than the solder ball height lower limit, suggesting that a large amount of the solder ball 450 flew along the trace 430a of the redistribution layer 430, so that the solder ball 450 having a predetermined height could not be formed.

The redistribution seed layer 440 is made of the same material as that of the redistribution seed layer 140 illustrated in FIG. 1, and performs the same operation as the redistribution seed layer 140 illustrated in FIG. 1. In the embodiment illustrated in FIG. 4, however, in which the insulation layer 120 of FIG. 1 is not formed, the redistribution seed layer 440 is formed between the redistribution layer 430 and the bond pad 113 and between the redistribution layer 430 and the passivation layer 114.

The solder ball 450 is fusibly attached onto the redistribution layer 430 in a substantially spherical shape, and is made of the same material as the solder ball 150 illustrated in FIG. 1 and performs the same operation as the solder ball 150.

The insulation layer 460 is made of the same material as the second insulation layer 160 illustrated in FIG. 1 and performs the same operation as the second insulation layer 160. In the embodiment illustrated in FIG. 4, however, in which the insulation layer 120 of FIG. 1 is not formed, the insulation layer 140 is formed directly on the redistribution layer 430 and the passivation layer 114 without the redistribution layer 430 to a predetermined thickness.

As described above, in the semiconductor device 400 according to still another embodiment of the present invention, the insulation layer 460 covering the redistribution layer 430 and the passivation layer 114, is made of a cheap, non-photosensitive material, instead of using a costly, photosensitive insulation layer. Accordingly, the manufacturing cost can be reduced. A board level reliability (BRL) in a stackable semiconductor device can also be improved.

Next, a semiconductor device 500 according to still another embodiment of the present invention will be described.

Figure 7:
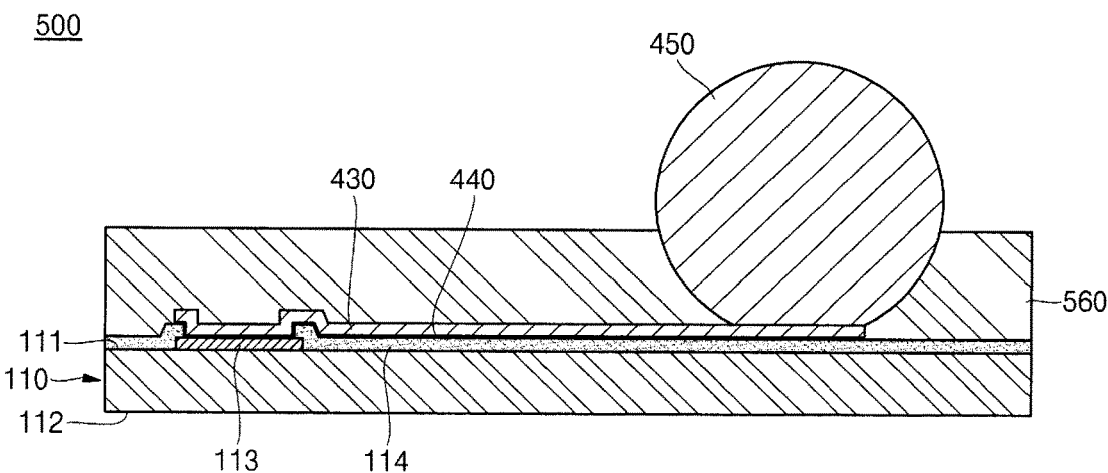
FIG. 7 is a sectional view illustrating a semiconductor device according to still another embodiment of the present invention.

Referring to FIG. 7, a sectional view illustrating the semiconductor device 500 according to still another embodiment of the present invention is illustrated.

As illustrated in FIG. 7, the semiconductor device 500 includes a semiconductor die 110, a redistribution layer 430, a redistribution seed layer 440, a solder ball 450, and a second insulation layer 560.

The semiconductor device 500 has substantially the same configuration and operation as the semiconductor device 400 illustrated in FIG. 4, except for the configuration of the insulation layer 560. Accordingly, components each having the same configuration and operation for describing the previous embodiment are respectively identified by the same reference numerals, and their repetitive description will not be given. In the following, an explanation will be given with special reference to the insulation layer 560.

The insulation layer 560 has substantially the same configuration and operation with the insulation layer 460. However, the insulation layer 560 according to the present embodiment is formed by attaching an insulative dry film made of a non-photosensitive material on the redistribution layer 430 and the passivation layer 114 without the redistribution layer 530.

As described above, in the semiconductor device 500 according to still another embodiment of the present invention, the insulation layer 560 covering the redistribution layer 430 and the passivation layer 114 is made of a cheap, non-photosensitive material, such as an insulative dry film, instead of using a costly, photosensitive insulation layer. Accordingly, the manufacturing process is simplified.

Next, a semiconductor device 600 according to still another embodiment of the present invention will be described.

Figure 8A:
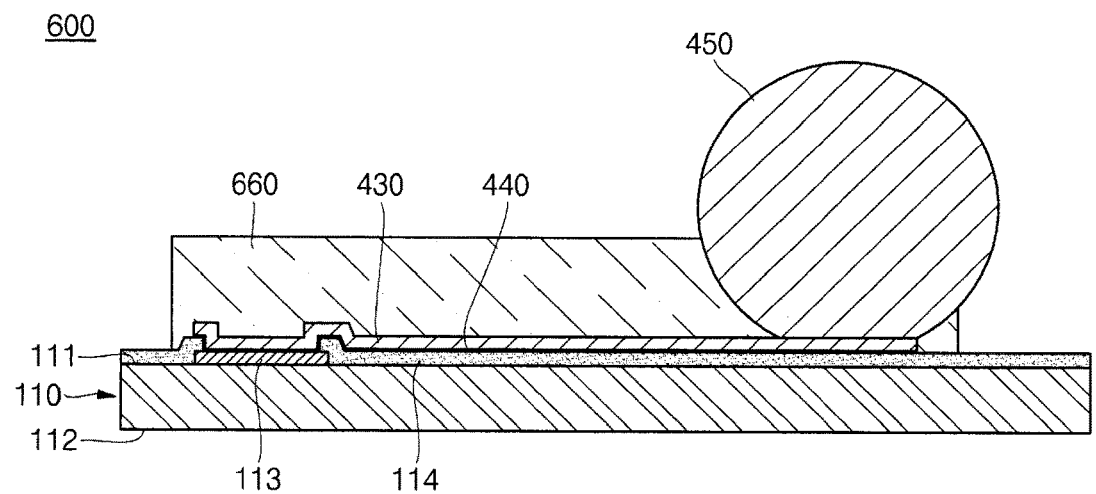
FIGS. 8A and 8B are a sectional view and a plan view illustrating a semiconductor device according to still another embodiment of the present invention.
Figure 8B:
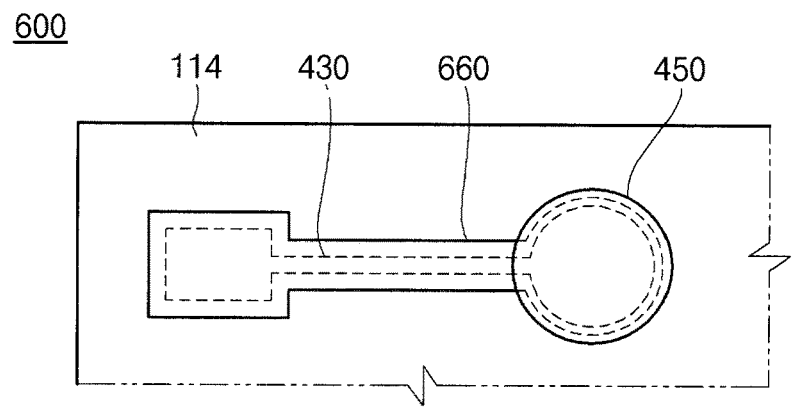

Referring to FIGS. 8A and 8B, a sectional view and a plan view illustrating the semiconductor device 600 according to still another embodiment of the present invention are illustrated.

As illustrated in FIG. 8A, the semiconductor device 600 according to still another embodiment of the present invention includes a semiconductor die 110, a redistribution layer 430, a redistribution seed layer 440, a solder ball 450, and an insulation layer 660.

The semiconductor device 600 has substantially the same configuration and operation as the semiconductor device 400 illustrated in FIG. 4, except for the insulation layer 660. Accordingly, components each having the same configuration and operation for describing the previous embodiment are respectively identified by the same reference numerals, and their repetitive description will not be given. In the following, an explanation will be given with special reference to the insulation layer 660.

The insulation layer 660 has substantially the same configuration and operation with the insulation layer 460, except that the insulation layer 660 according to the present embodiment is made of epoxy, i.e., is made of a non-photosensitive material. As illustrated in FIG. 8B, the insulation layer 660 is formed such that it covers a portion of the redistribution layer 430 and has the same planar shape as that of the redistribution layer 430. Stated another way, the insulation layer 660 has the same pattern as the redistribution layer 430 (except of course where the solder ball 450 is formed on the redistribution layer 430) and covers only the redistribution layer 430 and the adjacent portions of the passivation layer 114 thus exposing the remainder of the passivation layer 114.

As described above, in the semiconductor device 600 according to still another embodiment of the present invention, the insulation layer 660 covering the redistribution layer 430 and the passivation layer 114 is formed using a cheap, non-photosensitive material, such as epoxy, instead of forming a costly, photosensitive insulation layer, thereby reducing the manufacturing cost.

Alternatively, in the semiconductor device 600 according to still another embodiment of the present invention, the insulation layer 660 may be formed only on a portion of the redistribution layer 430, so that the redistribution layer 430 may not be disposed in a sawing line area during a wafer sawing process performed for singulation of the semiconductor device. Accordingly, the semiconductor device 600 according to still another embodiment of the present invention can reduce an amount of material required for forming the insulation layer 660, protect the redistribution layer 430 with a minimum amount of the insulation layer 660, and easily perform a sawing process. In addition, since the insulation layer 660 is partially formed on the semiconductor die, the insulation layer 660 is prevented from being peeled off or separated from the sawing line portion in a subsequent process following the sawing process.

Next, a semiconductor device 700 according to still another embodiment of the present invention will be described.

Figure 9A:
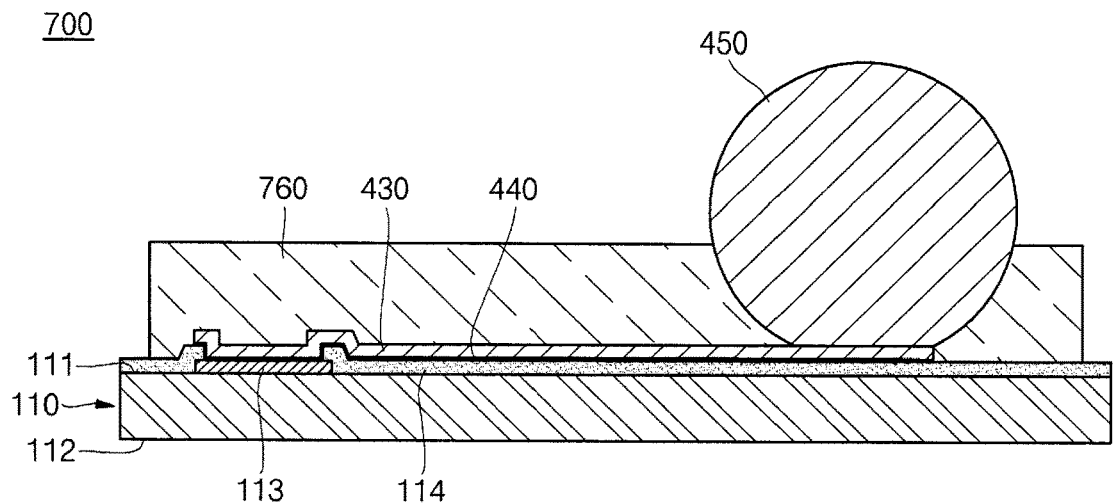
FIGS. 9A and 9B are a sectional view and a plan view illustrating a semiconductor device according to still another embodiment of the present invention.
Figure 9B:
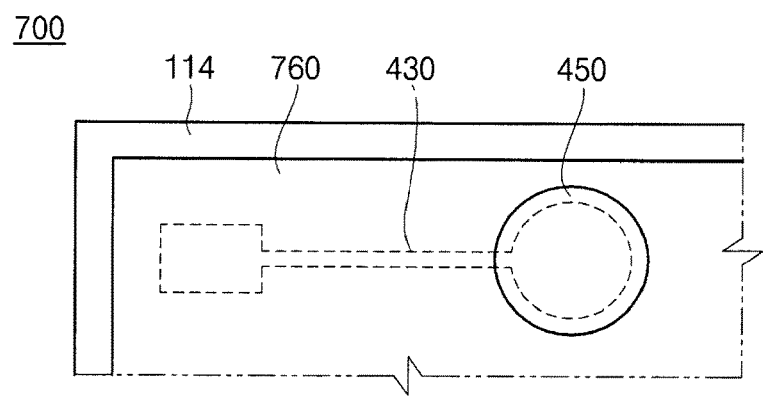

Referring to FIGS. 9A and 9B, a sectional view and a plan view illustrating the semiconductor device 700 according to still another embodiment of the present invention are illustrated.

As illustrated in FIG. 9A, the semiconductor device 700 includes a semiconductor die 110, a redistribution layer 430, a redistribution seed layer 440, a solder ball 450, and an insulation layer 760.

The semiconductor device 700 has substantially the same configuration and operation as the semiconductor device 400 illustrated in FIG. 4, except for the insulation layer 760. Accordingly, components each having the same configuration and operation for describing the previous embodiment are respectively identified by the same reference numerals, and their repetitive description will not be given. In the following, an explanation will be given with special reference to the insulation layer 760.

The insulation layer 760 is made of the same material as that of the insulation layer 660 illustrated in FIG. 8A, and performs the same operation as the insulation layer 660, except for the followings. As illustrated in FIG. 9B, the insulation layer 760 is formed such that it is extended outward from the outer periphery of the redistribution layer 430 so as to sufficiently cover the redistribution layer 430 and has a smaller area than that of the semiconductor die 110. Stated another way, the insulation layer 760 covers the entire first surface 111 of the semiconductor die 110 (except of course where the solder ball 450 is formed) and has a smaller area than the first surface 111 of the semiconductor die 110 such that the periphery of the first surface 111 of the semiconductor die 110 including the portion of the passivation layer 114 formed thereon is exposed from the insulation layer 760.

As described above, in the semiconductor device 700 according to still another embodiment of the present invention, the insulation layer 760 covering the redistribution layer 430 between the redistribution layer 430 and the passivation layer 114 is formed using a cheap, non-photosensitive material, such as epoxy, instead of forming a costly, photosensitive insulating layer. Accordingly, the manufacturing cost can be reduced and the redistribution layer 430 can be sufficiently protected from external impacts.

Next, a semiconductor device 800 according to still another embodiment of the present invention will be described.

Figure 10:
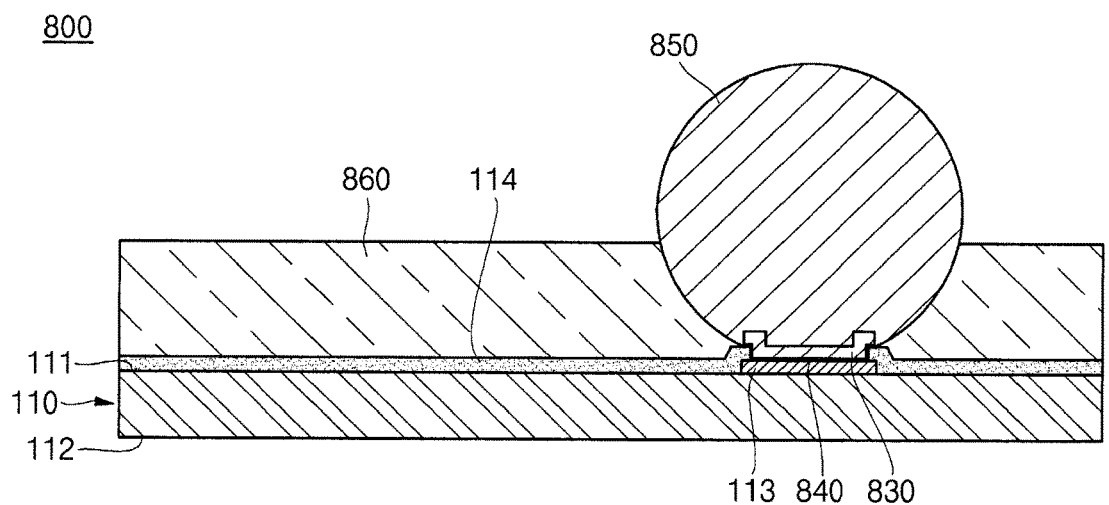
FIG. 10 is a sectional view illustrating a semiconductor device according to still another embodiment of the present invention.

Referring to FIG. 10, a sectional view illustrating the semiconductor device 800 according to still another embodiment of the present invention is illustrated.

As illustrated in FIG. 10, the semiconductor device 800 according to still another embodiment of the present invention includes a semiconductor die 110, a redistribution layer 830, a redistribution seed layer 840, a solder ball 850, and an insulation layer 860.

The semiconductor device 800 has substantially the same configuration and operation as the semiconductor device 400 illustrated in FIG. 4, except for the redistribution layer 830, the redistribution seed layer 840, the solder ball 850, and the insulation layer 860. Accordingly, components each having the same configuration and operation for describing the previous embodiment are respectively identified by the same reference numerals, and their repetitive description will not be given. In the following, an explanation will be given with special reference to the redistribution layer 830, the redistribution seed layer 840, the solder ball 850, and the insulation layer 860.

The redistribution layer 830 according to the present embodiment is made of the same material as that of the redistribution layer 430 illustrated in FIG. 4 and performs the same operation as the redistribution layer 430.

The redistribution seed layer 840 according to the present embodiment is made of the same material as that of the redistribution seed layer 440 illustrated in FIG. 4 and performs the same operation as the redistribution seed layer 440.

The solder ball 850 is fusibly attached onto a portion of the redistribution layer 830 in a substantially spherical shape, the portion vertically conforming to the bond pad 113, and is made of the same material as the solder ball 450 illustrated in FIG. 4 and performs the same operation as the solder ball 450. More particularly, the solder ball 850 is attached to the redistribution layer 830 directly above the bond pad 113.

The insulation layer 860 is made of the same material as the second insulation layer 160 illustrated in FIG. 1 and performs the same operation as the second insulation layer 160. In the embodiment illustrated in FIG. 10, however, in which the insulation layer 120 of FIG. 1 is not formed, the insulation layer 860 is formed on the passivation layer 114 to a predetermined thickness.

As described above, in the semiconductor device 800 according to still another embodiment of the present invention, the insulation layer 860 covering the passivation layer 114 is formed using a cheap, non-photosensitive material, instead of forming a costly, photosensitive insulation layer. Accordingly, the manufacturing cost can be reduced and a board level reliability in a stackable semiconductor device can also be improved.

Hereinafter, a manufacturing method of the semiconductor device 100 according to an embodiment of the present invention will be described.

Figure 11:
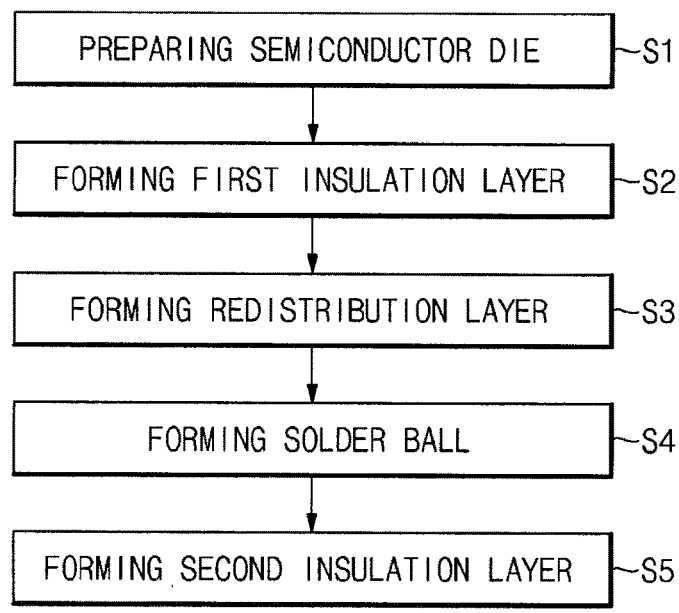
FIG. 11 is a flowchart illustrating a manufacturing method of a semiconductor device according to an embodiment of the present invention.

Referring to FIG. 11, a flowchart illustrating a manufacturing method of the semiconductor device 100 according to an embodiment of the present invention is illustrated. Referring to FIGS. 12A through 12E, sectional views sequentially illustrating the semiconductor device 100 at various stages during manufacture are illustrated.

As illustrated in FIG. 11, the manufacturing method of a semiconductor device 100 according to an embodiment of the present invention includes a preparing semiconductor die operation S1, a forming first insulation layer operation S2, a forming redistribution layer operation S3, a forming solder ball operation S4, and a forming second insulation layer operation S5.

As illustrated in FIGS. 12A through 12E, in preparing semiconductor die operation S1, the semiconductor die 110 is prepared. The semiconductor die 110 has a first surface 111, and a second surface 112 that is substantially planar and opposite to the first surface 111, the first surface 111 having at least one bond pad 113 formed thereon. Here, a passivation layer 114 is formed on the first surface 111 excluding the bond pad 113, i.e., the bond pad 113 is exposed through an opening in the passivation layer 114.

Figure 12A:
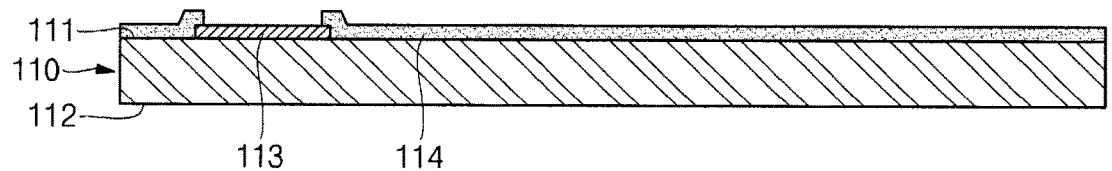
FIGS. 12A, 12B, 12C, 12D, 12E are sectional views sequentially illustrating the manufacturing method of the semiconductor device illustrated in FIG. 11.
Figure 12B:
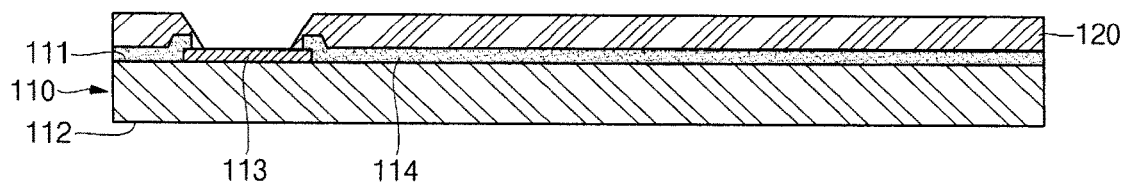

As illustrated in FIG. 12B, in forming first insulation layer operation S2, the first insulation layer 120 is formed on the passivation layer 114 corresponding to the outer periphery of the bond pad 113. In an exemplary embodiment, a photo-sensitive material is applied to the bond pad 113 and the passivation layer 114 by spin coating, screen printing or dispensing, followed by curing, thereby acquiring the first insulation layer 120 having a predetermined thickness. Subsequently, the first insulation layer 120 above the bond pad 113 may go through exposure and developing processes to expose the bond pad 113 outward through an opening in the first insulation layer 120.

Figure 12C:
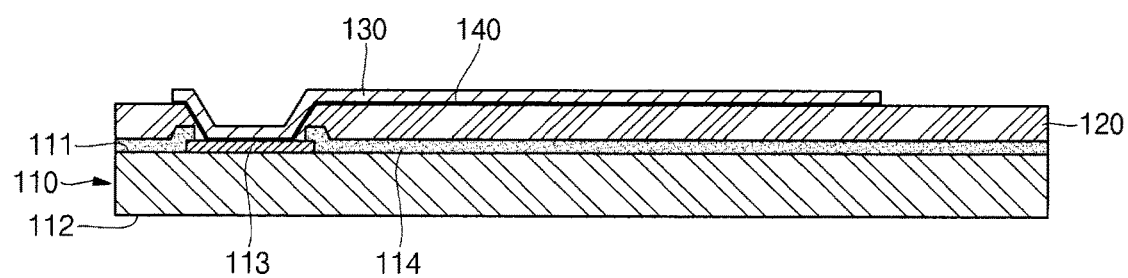

As illustrated in FIG. 12C, in forming redistribution layer operation S3, the redistribution layer 130 having a predetermined thickness is formed over the first insulation layer 120 and the bond pad 113 exposed outward through the first insulation layer 120. Further, in forming redistribution layer operation S3, before forming the redistribution layer 130, the redistribution seed layer 140 is formed over the first insulation layer 120 and the bond pad 113 exposed outward through the first insulation layer 120. The redistribution seed layer 140 may be used as a seed layer by plating the redistribution layer 130. The redistribution seed layer 140 may be formed by depositing a metal on the bond pad 113 and the first insulation layer 120 using sputtering, chemical vapor deposition (CVD), or plasma enhanced chemical vapor deposition (PECVD).

Figure 12D:
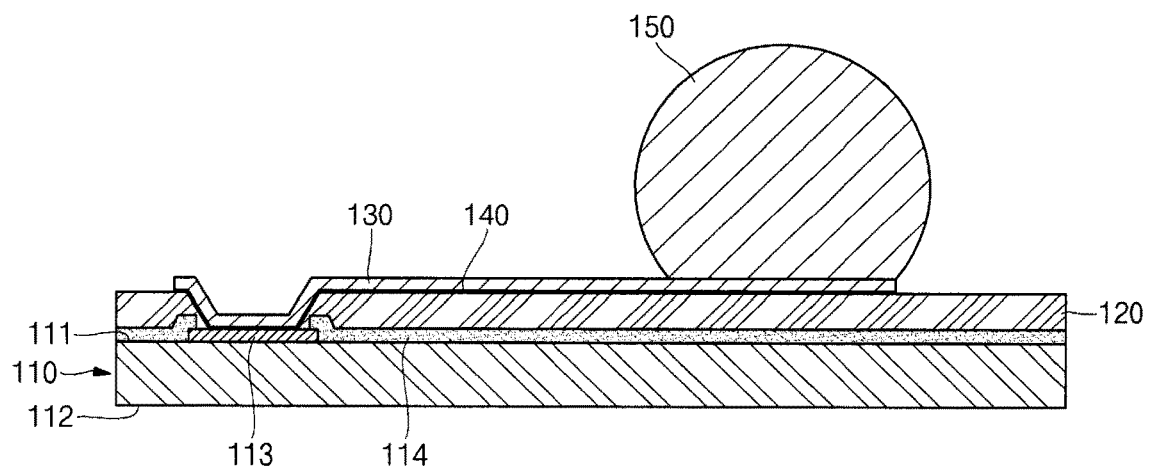

As illustrated in FIG. 12D, in forming solder ball operation S4, the substantially spherical solder ball 150 is fusibly attached onto the redistribution layer 130. In an exemplary embodiment, a viscous flux (not shown) may be applied to the redistribution layer 130 for positioning the solder ball 150 thereon. Then, the semiconductor die 110 is put into a furnace maintained at a temperature ranging from about 150° C. to about 250° C. and then taken out to evaporate the flux for removal, thereby fusibly attaching the spherical solder ball 150 to the redistribution layer 130.

Figure 12E:
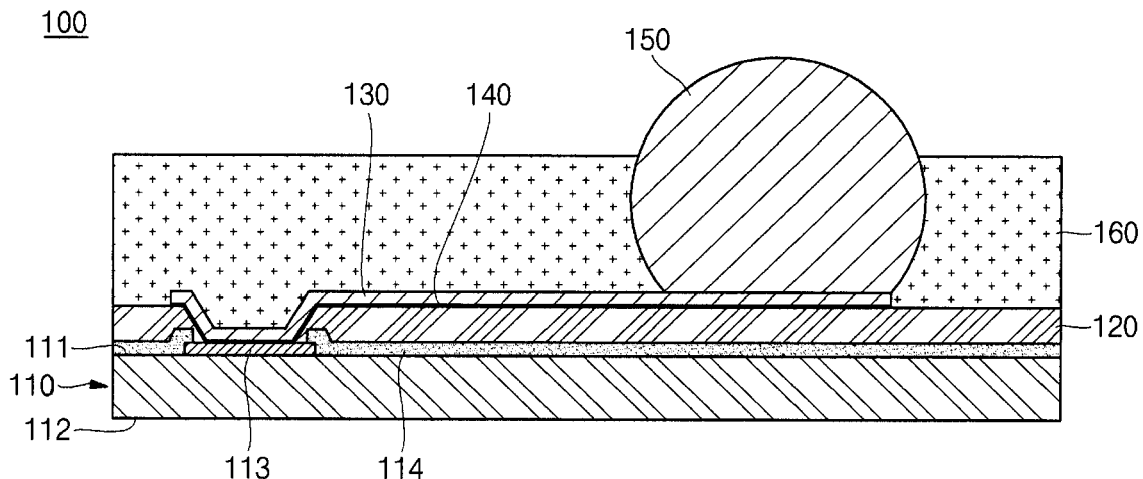

As illustrated in FIG. 12E, in forming second insulation layer operation S5, the second insulation layer 160 having a predetermined thickness is formed on the redistribution layer 130 and the first insulation layer 120 so as to expose upward the solder ball 150. The insulation layer 160 having a predetermined thickness may be formed by molding, printing, spin coating, or dispensing a non-photosensitive material, that is, at least one material selected from the group consisting of an epoxy molding compound (EMC), polyimide (PI), benzocyclobutene (BCB), polybenzoxazole (PBO), bismaleimidetriazine (BT), phenolic resin, and equivalents thereof, to the redistribution layer 130 and the first insulation layer 120, followed by curing, thereby acquiring the second insulation layer 160 having a predetermined thickness.

Meanwhile, in the forming of the second insulation layer of the semiconductor device 200 according to another embodiment of the present invention, an insulative dry film made of a non-photosensitive material, is attached onto the redistribution layer 130 and the first insulation layer 120 by laminating, thereby forming the second insulation layer 260 of FIG. 2. Here, in order to allow the insulative dry film to be easily attached onto the redistribution layer 130 and the first insulation layer 120 through the solder ball 150, a groove may be formed at a portion of the insulation layer dry film, the portion vertically conforming to the solder ball 150.

In the manufacturing method of the semiconductor device 300 according to still another embodiment of the present invention, epoxy flux in a liquid phase is coated on the first redistribution layer 130 and the first insulation layer 120 by printing and then positioned the solder ball 150 on the first redistribution layer 130, followed by curing, thereby forming the second insulation layer 360 of FIG. 3.

Next, a manufacturing method of the semiconductor device 400 according to still another embodiment of the present invention will be described.

Figure 13:
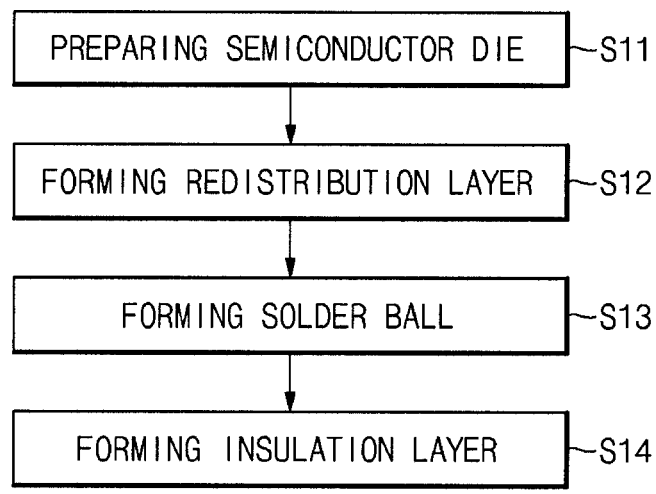
FIG. 13 is a flowchart illustrating a manufacturing method of a semiconductor device according to still another embodiment of the present invention.

Referring to FIG. 13, a flowchart illustrating a manufacturing method of the semiconductor device 400 according to still another embodiment of the present invention is illustrated. Referring to FIGS. 14A through 14D, sectional views sequentially illustrating the semiconductor device 400 at various stages during manufacture are illustrated.

As illustrated in FIG. 13, the manufacturing method of the semiconductor device 400 according to still another embodiment of the present invention includes a preparing semiconductor die operation S11, a forming redistribution layer operation S12, a forming solder ball operation S13, and a forming insulation layer operation S14.

Figure 14A:
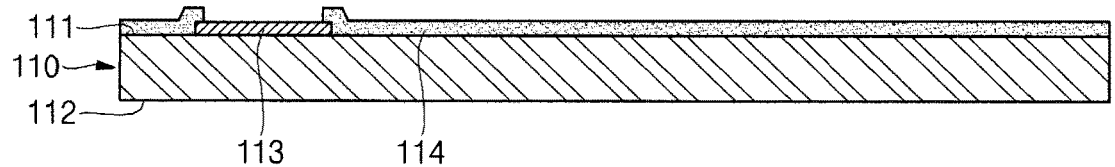
FIGS. 14A through 14D are sectional views sequentially illustrating the manufacturing method of the semiconductor device illustrated in FIG. 13.

As illustrated in FIG. 14A, since preparing semiconductor die operation S11 is the same as preparing semiconductor die operation S1 illustrated in FIG. 12A, a repeated explanation will not be given.

Figure 14B:
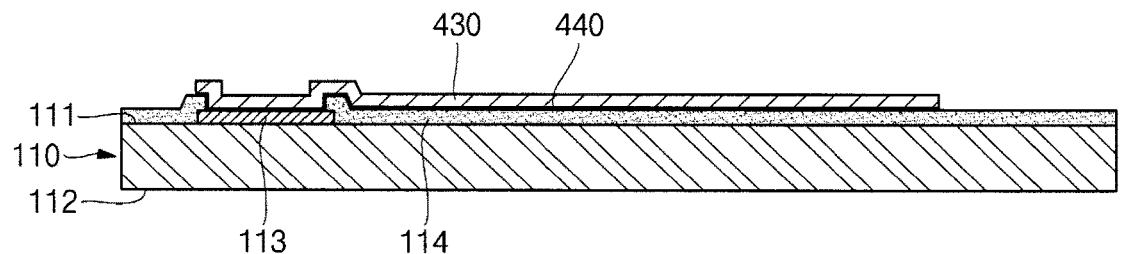

As illustrated in FIG. 14B, forming redistribution layer operation S12 is substantially the same as forming redistribution layer operation S3 illustrated in FIG. 12C. However, in forming redistribution layer operation S12, the redistribution layer 430 having a predetermined thickness is formed on the bond pad 113 exposed outward through the passivation layer 114 and the passivation layer 114. Here, the redistribution layer 430 is formed such that a line width W of a trace (430a of FIG. 5) becomes 50% or less of a diameter D of a ball pad (430b of FIG. 5). That is to say, the redistribution layer 430 is formed such that a ratio of the line width to the diameter, i.e., W/D, may not exceed 50%. Further, in forming redistribution layer operation S12, before the forming of the redistribution layer 430, the redistribution seed layer 440 is formed on the passivation layer 114 and the bond pad 113 exposed outward through the passivation layer 114. The redistribution seed layer 440 may be formed by depositing a metal on the bond pad 113 and the first insulation layer 120 using sputtering, chemical vapor deposition (CVD), or plasma enhanced chemical vapor deposition (PECVD).

Figure 14C:
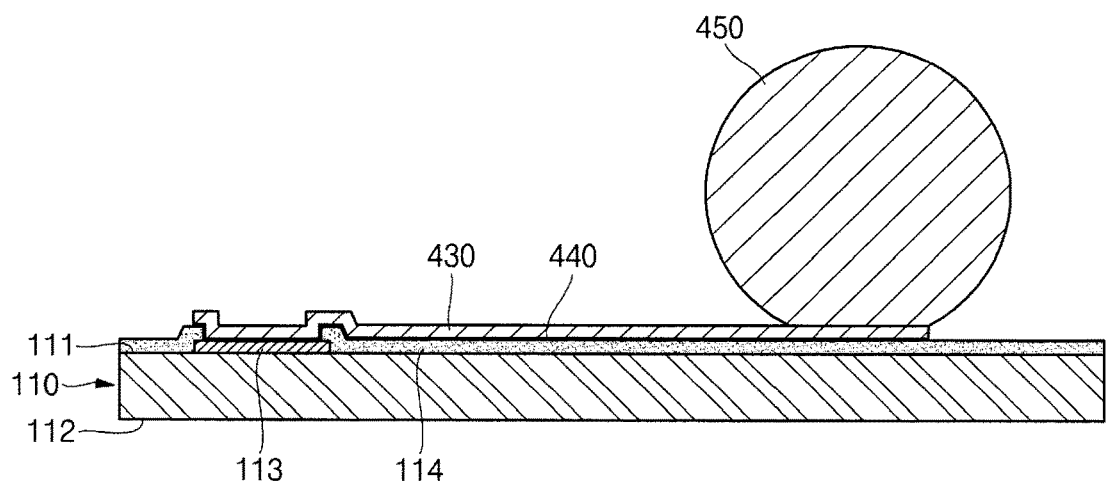

As illustrated in FIG. 14C, in forming solder ball operation S13, the substantially spherical solder ball 450 is fusibly attached onto the redistribution layer 430. In an exemplary embodiment, a viscous flux (not shown) may be applied to the redistribution layer 430 for positioning the solder ball 450 thereon. Then, the semiconductor die 110 is put into a furnace maintained at a temperature ranging from about 150° C. to about 250° C. and then taken out to evaporate the flux for removal, thereby fusibly attaching the spherical solder ball 450 to the redistribution layer 430.

Figure 14D:
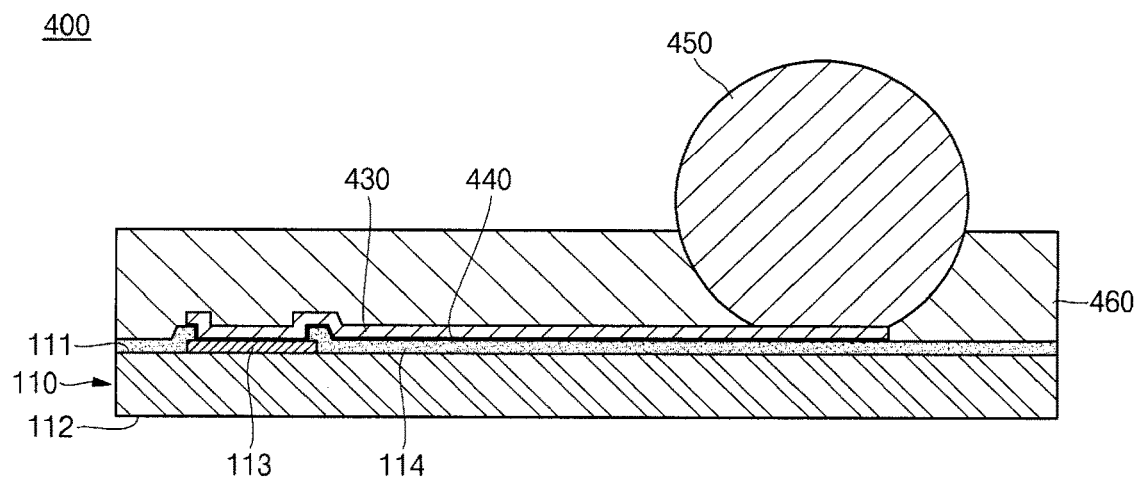

As illustrated in FIG. 14D, in forming insulation layer operation S14, the insulation layer 460 having a predetermined thickness is formed on the redistribution layer 430 and the passivation layer 114 so as to expose upward the solder ball 450. In an exemplary embodiment, a non-photosensitive material, that is, at least one selected from the group consisting of an epoxy molding compound (EMC), polyimide (PI), benzocyclobutene (BCB), polybenzoxazole (PBO), bismaleimidetriazine (BT), phenolic resin, and equivalents thereof, is applied to the redistribution layer 430 and the passivation layer 114 by molding, printing, spin coating, or dispensing, followed by curing, thereby acquiring the insulation layer 460 having a predetermined thickness.

Meanwhile in the manufacturing method of the semiconductor device 500 according to still another embodiment of the present invention, an insulative dry film, which is a non-photosensitive material, is attached onto the redistribution layer 430 and the passivation layer 114 by laminating, thereby forming the insulation layer 560 of FIG. 7. Here, in order to allow the insulative dry film to be easily attached onto the redistribution layer 430 and the passivation layer 114 through the solder ball 450, a groove may be formed at a portion of the insulation layer dry film, the portion vertically conforming to the solder ball 450.

Further, in the manufacturing methods of the semiconductor devices 600 and 700 according to other embodiments of the present invention, in order to form insulating layers 660 of FIG. 8A and 760 of FIG. 9A, epoxy flux in a liquid phase is first coated on the first redistribution layer 430 and the passivation layer 114 by printing, and then positioned the solder ball 450 on the redistribution layer 430, followed by curing, thereby forming the insulation layers 660 of FIG. 8A and 760 of FIG. 9A. Here, in order to form the insulation layer 660 illustrated in FIG. 8A, the liquid phase epoxy flux is coated along a portion of the redistribution layer 430. In addition, in order to form the insulation layer 760 illustrated in FIG. 9A, the liquid phase epoxy flux is coated to the semiconductor die 110 so as to sufficiently cover a portion of the redistribution layer 430 while not blanket coating the semiconductor die 110 so as not to cover all over the surface of the passivation layer 114.

In the manufacturing method of the semiconductor device 800 according to still another embodiment of the present invention, the forming of the insulation layer 860 includes forming the insulation layer 860 having a predetermined thickness on the passivation layer 114 so as to expose upward the solder ball 850 attached to the redistribution layer 830 vertically conforming to the bond pad 113. In an exemplary embodiment, a non-photosensitive material, that is, at least one selected from the group consisting of an epoxy molding compound (EMC), polyimide (PI), benzocyclobutene (BCB), polybenzoxazole (PBO), bismaleimidetriazine (BT), phenolic resin, and equivalents thereof, is applied to the passivation layer 114 by molding, printing, spin coating, or dispensing, followed by curing, thereby acquiring the insulation layer 860 having a predetermined thickness.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process, may be implemented by one skilled in the art in view of this disclosure.

What is claimed is:

1. A semiconductor device comprising:
   a semiconductor die comprising:
      a top die surface; and
      a bond pad on the top die surface;
   a conductive layer comprising a first end coupled to the bond pad, wherein the conductive layer extends laterally from the bond pad over the top die surface;
   a conductive interconnection structure coupled to a second end of the conductive layer; and
   an insulation layer formed directly on the conductive interconnection structure and on the conductive layer, the insulation layer comprising a single continuous layer of a non-photosensitive material that laterally surrounds a lower portion of the conductive interconnection structure and does not laterally surround an upper portion of the conductive interconnection structure, wherein:
the lower portion of the conductive interconnection structure that is surrounded by the insulation layer is shaped like a portion of a sphere, the portion of the sphere comprising a curvature in a vertical cross-sectional view; and
the single continuous layer of the non-photosensitive material that laterally surrounds the lower portion of the conductive interconnection structure conforms, in the vertical cross-sectional view, to said curvature.

2. The semiconductor device of claim 1, wherein the insulation layer comprises a bottom side that faces toward the semiconductor die, and a top side that is exposed from the completed semiconductor device.

3. The semiconductor device of claim 1, wherein:
the conductive layer comprises only a seed layer and a single electroplated layer on the seed layer; and
the conductive interconnection structure is entirely above the conductive layer.

4. The semiconductor device of claim 1, wherein the single continuous layer of the non-photosensitive material is formed to laterally surround and conform to a pre-existing shape of the conductive interconnection structure.

5. The semiconductor device of claim 1, wherein the insulation layer is directly on the conductive layer.

6. The semiconductor device of claim 1, wherein:
a first contacting surface of the single continuous layer of the non-photosensitive material directly contacts the conductive interconnection structure; and
no part of the first contacting surface is linear.

7. The semiconductor device of claim 1, comprising a passivation layer between the insulation layer and the top die surface, wherein the passivation layer comprises an aperture through which the bond pad is coupled to the first end of the conductive layer.

8. The semiconductor device of claim 7, comprising a lower insulation layer between the conductive layer and the passivation layer, the lower insulation layer comprising a photosensitive material and a bond pad aperture through which the bond pad is coupled to the first end of the conductive layer.

9. The semiconductor device of claim 1, wherein no portion of any lateral side surface of the conductive interconnection structure is straight.

10. The semiconductor device of claim 1, wherein:
the conductive layer comprises a pad with a diameter D and a trace extending from the pad with a width of W;
the conductive interconnection structure is coupled to the pad and has a height greater than 235 um; and
W is less than half of D.

11. The semiconductor device of claim 1, wherein the first end of the conductive layer is directly coupled to the bond pad.

12. A method of manufacturing a semiconductor device, the method comprising:
providing a semiconductor die that comprises:
a top die surface; and
a bond pad on the top die surface;
providing a conductive layer comprising a first end coupled to the bond pad, wherein the conductive layer extends laterally from the bond pad over the top die surface;
providing a conductive interconnection structure coupled to a second end of the conductive layer; and
providing an insulation layer formed directly on the conductive interconnection structure and on the conductive layer, the insulation layer comprising a single continuous layer of a non-photosensitive material that laterally surrounds a lower portion of the conductive interconnection structure and does not laterally surround an upper portion of the conductive interconnection structure, wherein:
the lower portion of the conductive interconnection structure that is surrounded by the insulation layer is shaped like a portion of a sphere, the portion of the sphere comprising a curvature in a vertical cross-sectional view; and
the single continuous layer of the non-photosensitive material that laterally surrounds the lower portion of the conductive interconnection structure conforms, in the vertical cross-sectional view, to said curvature.

13. The method of claim 12, wherein the insulation layer comprises a bottom side that faces toward the semiconductor die, and a top side that is exposed from the completed semiconductor device.

14. The method of claim 12, wherein:
the conductive layer comprises only a seed layer and a single electroplated layer on the seed layer; and
the conductive interconnection structure is entirely above the conductive layer.

15. The method of claim 14, wherein the lower portion of the conductive interconnection structure that is surrounded by the insulation layer comprises a convex conductive surface portion that is convex in a direction toward the provided conductive layer.

16. The method of claim 15, wherein the conductive interconnection structure comprises an upper convex conductive surface portion that is convex in a direction away from the conductive layer and protrudes upward from the insulation layer.

17. The method of claim 12, wherein the single continuous layer of the non-photosensitive material is formed to laterally surround and conform to a pre-existing shape of the conductive interconnection structure.

18. The method of claim 12, wherein the insulation layer is directly on the conductive layer.

19. The method of claim 12, wherein:
a first contacting surface of the single continuous layer of the non-photosensitive material directly contacts the conductive interconnection structure; and
no part of the first contacting surface is linear.

* * * * *